(12) United States Patent
Ikenaga et al.

(10) Patent No.: US 11,424,108 B2
(45) Date of Patent: Aug. 23, 2022

(54) PLASMA PROCESSING APPARATUS

(71) Applicant: HITACHI HIGH-TECH CORPORATION, Tokyo (JP)

(72) Inventors: Kazuyuki Ikenaga, Tokyo (JP); Masaki Ishiguro, Tokyo (JP); Masahiro Sumiya, Tokyo (JP); Shigeru Shirayone, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 446 days.

(21) Appl. No.: 14/834,404

(22) Filed: Aug. 24, 2015

(65) Prior Publication Data
US 2016/0172161 A1 Jun. 16, 2016

(30) Foreign Application Priority Data

Dec. 16, 2014 (JP) .............................. JP2014-253583

(51) Int. Cl.
*H01L 21/00* (2006.01)
*C23C 16/00* (2006.01)
*H01J 37/32* (2006.01)

(52) U.S. Cl.
CPC .. *H01J 37/32715* (2013.01); *H01J 37/32568* (2013.01); *H01J 37/32577* (2013.01);
(Continued)

(58) Field of Classification Search
CPC ................................................. H01J 37/32697
See application file for complete search history.

(56) References Cited

U.S. PATENT DOCUMENTS 5,034,688 A * 7/1991 Moulene ............ G01R 31/2874
165/80.4
5,463,526 A * 10/1995 Mundt .................... C23C 28/00
361/230

(Continued)

FOREIGN PATENT DOCUMENTS

CN 1842242 A 10/2006
EP 1708241 A1 10/2006
(Continued)

OTHER PUBLICATIONS

JP2013-008987A Mamoru et al., Plasma Processing Device and Plasma Processing Method, Jan. 10, 2013, paragraphs [0014]-[0015], (Year: 2013).*

(Continued)

*Primary Examiner* — Sylvia Macarthur
*Assistant Examiner* — Michelle Crowell
(74) *Attorney, Agent, or Firm* — Miles & Stockbridge, P.C.

(57) ABSTRACT

Provided is a plasma processing apparatus capable of obtaining desired etch profiles and preventing the degradation of yield rates due to the adhesion of particles, and equipped with a processing chamber in which a sample is plasma-treated; a radio-frequency power source for supplying radio-frequency power used to generate plasma; a sample stage which is provided with electrodes for electrostatically adsorbing the sample and on which the sample is mounted; and a DC power supply for applying DC voltages to the electrodes, the apparatus being further equipped with a control apparatus for controlling the DC power supply so as to apply such DC voltages as to decrease the absolute value of the potential of the sample in the absence of the plasma.

4 Claims, 8 Drawing Sheets

(52) U.S. Cl.
CPC .. *H01J 37/32697* (2013.01); *H01J 37/32706* (2013.01); *H01J 37/32724* (2013.01)

(56) References Cited

U.S. PATENT DOCUMENTS

| | | | | |
|---|---|---|---|---|
| 6,084,763 | A * | 7/2000 | Hirano | H01L 21/67248 279/128 |
| 7,297,894 | B1 * | 11/2007 | Tsukamoto | H01L 21/67103 118/724 |
| 8,920,665 | B2 * | 12/2014 | Sato | H01J 37/32577 156/345.51 |
| 10,002,782 | B2 * | 6/2018 | Kimball | H01L 21/6833 |
| 10,217,616 | B2 * | 2/2019 | Harada | H01J 37/32724 |
| 2004/0188021 | A1 * | 9/2004 | Mitrovic | H01L 21/6833 156/345.52 |
| 2005/0174135 | A1 * | 8/2005 | Matsuda | H01L 21/67248 216/60 |
| 2006/0283549 | A1 * | 12/2006 | Aramaki | H01J 37/32091 156/345.28 |
| 2008/0110569 | A1 * | 5/2008 | Miya | H01J 37/32972 156/345.35 |
| 2008/0236614 | A1 * | 10/2008 | Yakushiji | H01L 21/3065 134/1.1 |
| 2008/0237184 | A1 | 10/2008 | Yakushiji et al. | |
| 2011/0318936 | A1 * | 12/2011 | Ko | H01J 37/32091 438/724 |
| 2012/0129354 | A1 * | 5/2012 | Luong | H01L 21/6831 438/714 |
| 2015/0132863 | A1 * | 5/2015 | Oohashi | H01J 37/32082 438/5 |
| 2016/0035610 | A1 * | 2/2016 | Park | H01L 21/6833 156/345.29 |
| 2016/0079043 | A1 * | 3/2016 | Kobayashi | H01L 21/31138 438/714 |
| 2016/0196996 | A1 * | 7/2016 | Jing | H01J 37/32715 361/234 |
| 2017/0194157 | A1 * | 7/2017 | Ishiguro | H01L 21/67069 |

FOREIGN PATENT DOCUMENTS

| | | | | |
|---|---|---|---|---|
| JP | 05-190653 | A | | 7/1993 |
| JP | 09-293775 | A | | 11/1997 |
| JP | 10-150100 | A | | 6/1998 |
| JP | 11-297802 | A | | 10/1999 |
| JP | 2004-022775 | A | | 1/2004 |
| JP | 2007-266296 | A | | 10/2007 |
| JP | 2010010231 | A * | 1/2010 | |
| JP | 2010-187023 | A | | 8/2010 |
| JP | 2013-008987 | A | | 1/2013 |
| JP | 2014011215 | A * | 1/2014 | H01J 37/32697 |
| JP | 2014-068032 | A | | 4/2014 |
| JP | 2014-186994 | A | | 10/2014 |
| KR | 20070000973 | A * | 1/2007 | H01L 21/67103 |
| TW | 201344740 | A | | 11/2013 |
| TW | 201440140 | A | | 10/2014 |

OTHER PUBLICATIONS

JP2014-068032A Naoyuki et al., Sample Table and Plasma Processing Apparatus equipped with the same, Apr. 17, 2014, paragraph [0020]]. (Year: 2014).*

JP2004-022775A Ryuichi et al., Method and Equipment for measuring potential of wafer., Jan. 22, 2004, Mitsubishi Heavy Ind. Ltd., pp. 4-9. (Year: 2004).*

Office Action dated Oct. 12, 2016 for related Korean Patent Application No. 10-2015-0108307.

Office Action dated Sep. 22, 2016 for related Tawainese Patent Application No. 104126389.

* cited by examiner

PLASMA PROCESSING APPARATUS

BACKGROUND OF THE INVENTION

The present invention relates to a plasma processing apparatus used in the manufacture of semiconductor devices, substrates for flat-panel displays, and the like.

In a process for manufacturing semiconductor devices or flat-panel displays, processing techniques, such as plasma chemical vapor deposition (CVD) and plasma etching, are used in order to form desired patterns. In a plasma processing apparatus used for such techniques, a substrate to be treated, such as a wafer, is placed on a stage disposed in a processing chamber, and a process gas, such as Ar, $O_2$, $N_2$, $CHF_3$, $CH_4$, $C_5F_8$, $C_4F_8$, $CF_4$, $SF_6$, $NF_3$, HBr, $Cl_2$ or $BCl_3$, is supplied into the processing chamber.

The inside pressure of the processing chamber is regulated to a desired pressure by exhaust means which combines a turbo-molecular pump and a dry pump and by pressure regulation means, such as a butterfly valve. After the processing chamber reaches the desired pressure, source radio-frequency power for plasma generation is applied to turn the process gas into plasma, and bias radio-frequency power for incident ion control is applied to the substrate to be treated to perform film formation and etching on the substrate.

In plasma etching, etching conditions adapted to film types are required since a substrate in which films of different types are laminated is treated. In addition, etching conditions may differ among the early, middle and final phases of etching treatment even in the case of the same film type. For example, selectivity between a film being etched and a film underlying the film being etched may be required in the final phase of etching treatment, and therefore, etching conditions may be changed to those under which the underlying film is unlikely to be etched. As described above, etching conditions used to treat a single substrate to be treated are composed of a plurality of etching steps.

Examples of parameters of etching conditions include gas type, pressure, source radio-frequency power, bias radio-frequency power, and coolant temperature and heater temperature for controlling stage temperature. It is increasingly difficult to satisfy desired etch profile requirements due to miniaturization in terms of feature size. In order to cope with this difficulty, there has been proposed a method for controlling wafer temperature by varying stage temperature for each etching step, thereby controlling an etch profile. For example, there is a method for varying the inside and outside temperatures of the stage during etching and during the interruption of etching treatment by means of a heater formed within the stage and the pressure of He gas supplied to between a substrate to be treated and a surface of the stage to control wafer temperature, as described in JP-A-2010-187023.

On the other hand, there has been proposed a method for preventing a change in the adsorption force of a wafer caused by a change in the electrical resistance value of a dielectric material between the wafer and electrodes built in the stage due to a change in stage temperature. For example, there has been proposed a method, as described in JP-A-H09-293775, in which electrodes different in the distance from a wafer-adsorbing surface are disposed within a stage, and an electrode used for adsorption is selected according to stage temperature. There has been proposed another method in which voltages applied to electrodes are varied using a variable DC power supply to control a potential difference between the wafer-adsorbing surface of a dielectric material and a wafer, thereby maintaining the adsorption force of the wafer constant.

In addition, as described in, for example, JP-A-H10-150100, there has been proposed a method for setting the adsorption area ratio of two electrodes different in polarity to 1:1, thereby equalizing the amounts of electric charge accumulated in the positive and negative electrode-side adsorption sections of a dielectric film immediately before stopping the supply of DC voltages, in order to suppress a residual adsorption force. Yet additionally, as described in JP-A-H05-190653, there has been proposed a method for providing a dielectric material with a temperature sensor and a current monitor to detect a resistivity change caused by a temperature change in the dielectric material, thereby controlling voltages to be applied to electrodes.

SUMMARY OF THE INVENTION

In the method disclosed in JP-A-2010-187023 in which wafer temperature is controlled by means of a heater and the pressure of He gas during etching and during the interruption of etching treatment and thereby an etch profile is controlled, no consideration is given to a wafer potential which shifts due to a change in stage temperature. In addition, in the methods disclosed in JP-A-H09-293775, JP-A-H10-150100 and JP-A-H05-190653 in which DC voltages applied to electrodes are adjusted to control the potential difference between the wafer-adsorbing surface of the dielectric material and the wafer, no consideration is given to a wafer potential which shifts due to a change in the DC voltages. Yet additionally, equalizing the amounts of electric charge accumulated in the positive and negative electrode-side adsorption sections of the dielectric film does not necessarily mean that a shift in the wafer potential is suppressed for such wafers on the back side of which thin films are also formed as those used in a mass-production line.

The potential of a wafer when voltages equal in absolute value are applied to a pair of electrodes different in polarity, i.e., when the average value of the voltages applied to the electrodes is 0 V equals 0 V. However, varying stage temperature and voltages applied to the electrodes causes the wafer potential to shift from 0 V. Experiments conducted by the inventors have proved that shifting of the wafer potential from 0 V during the interruption of discharge contributes to attracting particles to the wafer.

For example, if stage temperature is changed during the interruption of etching treatment, the wafer potential shifts from 0 V due to a resistivity change in the dielectric material, i.e., wafer surfaces become charged. If wafer surfaces are charged, particles released from inner walls of a chamber during the interruption of etching treatment are attracted to the wafer. In addition, if stage temperature is varied during etching treatment, the wafer potential is in a state of being shifted from 0 V when plasma is extinguished at the completion of etching treatment. As a result, particles released from the inner walls of the chamber are attracted to the wafer, as described above. That is, such a condition in which the inside and outside temperatures of the stage differ at the moment when etching treatment, which is a first processing step, is started results in shifting of the wafer potential from 0 V, thus attracting particles to the wafer.

In addition, if, for example, stage temperature is changed by applying voltages different in absolute value to a pair of electrodes different in polarity, in order to maintain the adsorption force constant when the stage temperature is changed, particles released from inner walls of a chamber are attracted to the wafer unless the amount of shift in the wafer potential is taken into consideration.

If particles adhere to the wafer in this way, these particles serve as a mask to cause pattern short-circuiting or discontinuity, thus giving rise to device defects and degrading yield rates. That is, the change of stage temperature for the purpose of controlling an etch profile or the change of applied voltages made to keep constant the force of wafer adsorption when the stage temperature is changed causes the wafer potential to shift from 0 V, thus allowing particles to adhere onto the wafer.

For such reasons as described above, the present invention provides a plasma processing apparatus capable of obtaining desired etch profiles and preventing the degradation of yield rates due to the adhesion of particles.

A plasma processing apparatus of the present invention is equipped with a processing chamber in which a sample is plasma-treated; a radio-frequency power source for supplying radio-frequency power used to generate plasma; a sample stage which is provided with electrodes for electrostatically adsorbing the sample and on which the sample is mounted; and a DC power supply for applying DC voltages to the electrodes, the apparatus being further equipped with a control apparatus for controlling the DC power supply so as to apply such DC voltages as to decrease the absolute value of the potential of the sample in the absence of the plasma.

The present invention makes it possible to obtain desired etch profiles and prevent the degradation of yield rates due to the adhesion of particles.

Other objects, features and advantages of the invention will become apparent from the following description of the embodiments of the invention taken in conjunction with the accompanying drawings.

DESCRIPTION OF THE EMBODIMENTS

Hereinafter, each embodiment of the present invention will be described while referring to the accompanying drawings.

Embodiment 1

Figure 1:
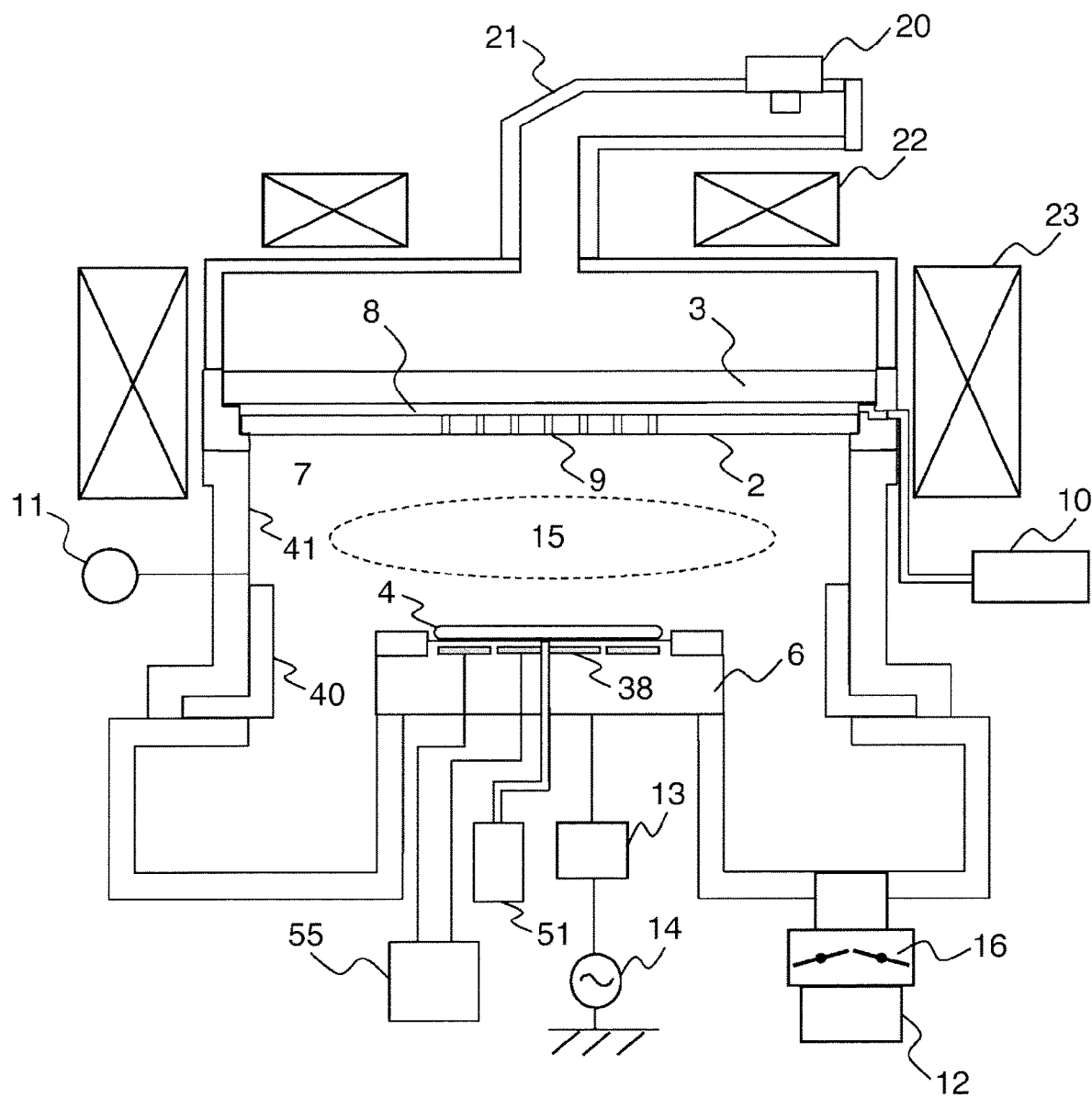
FIG. 1 is a schematic cross-sectional view illustrating a plasma processing apparatus according to the present invention.

FIG. 1 illustrates a schematic cross-sectional view of a plasma processing apparatus according to the present invention. A stage 6, which is a sample stage to be mounted with a wafer 4 serving as a sample, is disposed in a processing chamber 7 in which plasma 15 is generated to treat the wafer 4 which is a substrate to be treated. An impedance-matching box 13 and a radio-frequency power source 14 for applying a radio-frequency voltage to the wafer 4 during plasma treatment are connected to the stage 6.

A ceramic plate 3 is provided in an upper section of the processing chamber 7, in order to maintain a vacuum in the processing chamber 7. A ceramic plate 2 provided with a plurality of through-holes 9 is disposed in such a position below the ceramic plate 3 as to form a gap 8. A process gas is flow rate-controlled by gas flow rate control means 10 and uniformly supplied from the through-holes 9 to the processing chamber 7 through the gap 8. The processing chamber 7 is provided with pressure detection means 11, pressure regulation means 16 and exhaust means 12, in order to control the pressure of the processing chamber 7.

A magnetron oscillator 20 for outputting microwaves, and a waveguide 21 for propagating microwaves to the processing chamber 7 are disposed around the processing chamber 7. In addition, solenoid coils 22 and 23 which are magnetic field generation means are disposed above and alongside the processing chamber 7, respectively. Microwaves oscillated from the magnetron oscillator 20 propagate through the interior of the waveguide 21 and are radiated to the processing chamber 7 through the ceramic plates 3 and 2. Electron cyclotron resonance (ECR) is caused by the interaction between an electric field resulting from the microwaves and a magnetic field generated by the solenoid coils 22 and 23 to generate the plasma 15.

Figure 2:
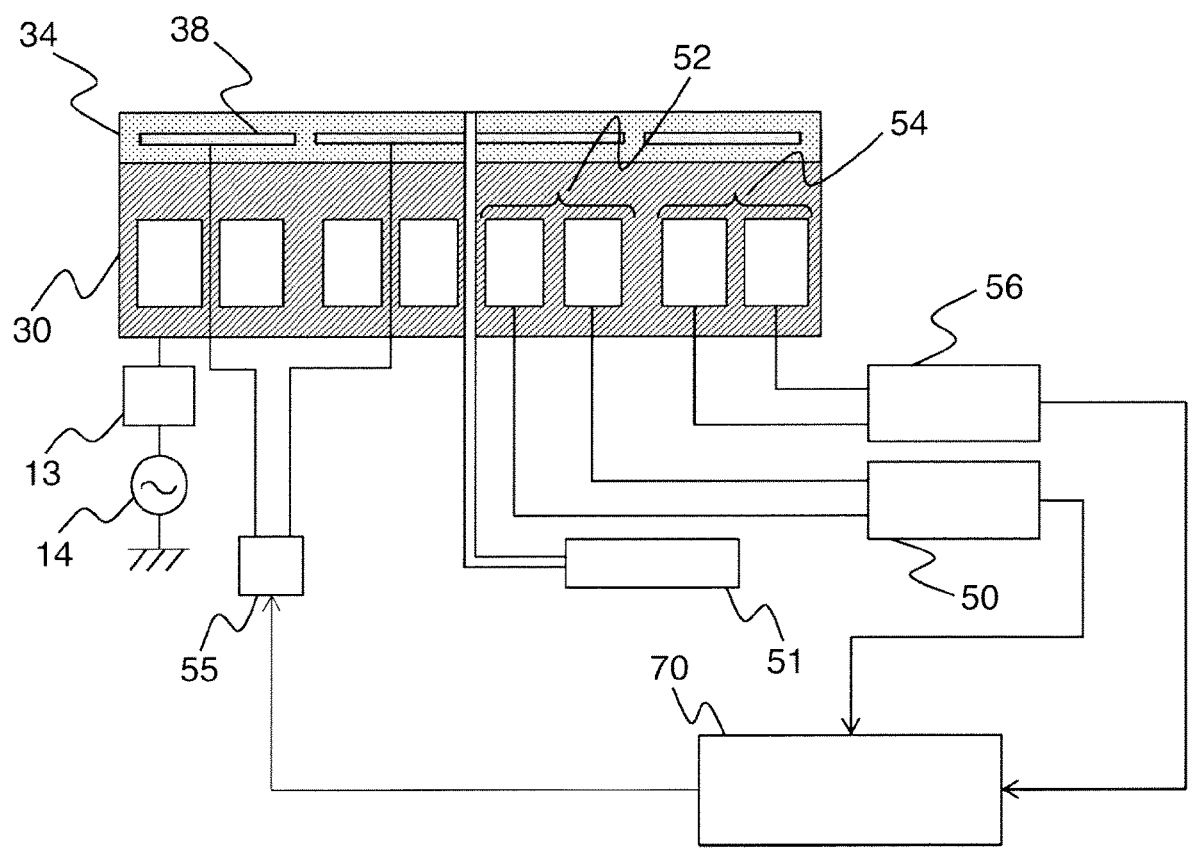
FIG. 2 is a schematic view illustrating the structure of a stage 6 according to Embodiment 1.

FIG. 2 illustrates one example of the configuration of the stage 6 disposed in the processing chamber 7. The stage 6 is provided with a metallic base material 30 made from Al, Ti or the like, and a dielectric layer 34 formed on the upper surface of the blast-treated metallic base material 30 using, for example, a ceramic sprayed film of $Al_2O_3$, $Y_2O_3$ or the like. Bipolar electrodes 38 for electrostatic chuck formed from an electrical conductor, such as Ti or W, are disposed within the dielectric layer 34 and connected to the DC power supply 55, in order to electrostatically adsorb the wafer 4 mounted on the stage 6. Voltages different in polarity are applied from the DC power supply 55 to the bipolar electrodes 38 to hold the wafer 4. Note that the bipolar electrodes 38 for electrostatic chuck refers to electrostatically-adsorbing electrodes in which a closed circuit can be formed using two electrodes without plasma being present therebetween to enable electrostatic chuck by applying voltages different in polarity to the two electrodes.

Two inside and outside coolant flow path systems are disposed within the metallic base material 30, in order to adjust the temperature of the wafer 4 mounted on the stage 6. An inside coolant flow path 52 is connected through a coolant circulation apparatus 50 having the function of controlling coolant temperature and piping, whereas an outside coolant flow path 54 is connected through a coolant circulation apparatus 56 and piping. A gas supply mechanism 51 for supplying He gas, for example, is connected to a gap between the stage 6 and the wafer 4. The temperature of a coolant supplied to the inner and outer sides of the stage is controlled to adjust the temperature of the stage and the temperature of the stage is transferred to the wafer 4 mounted on the stage 6 by means of the pressure and flow rate of the He gas, thereby controlling the wafer 4 to a predetermined temperature. When the temperature of the stage 6 is changed, i.e., the temperature of the coolant is changed, the coolant is heated or cooled in the coolant circulation apparatuses 50 and 56 and is, thus, controlled to the predetermined temperature.

Figure 7:
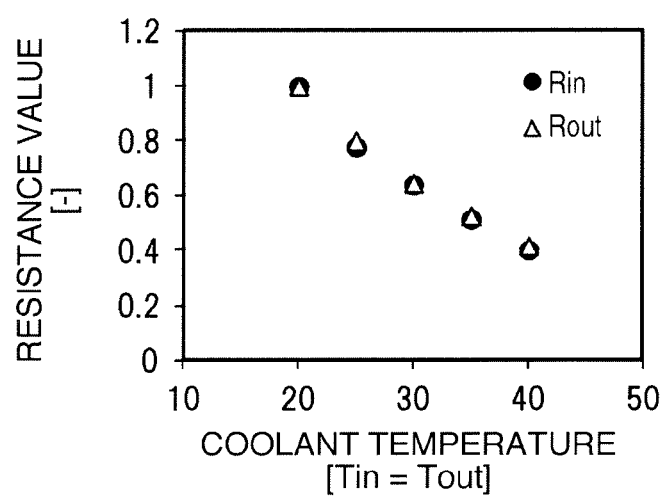
FIG. 7 is a graphical representation illustrating the temperature dependence of the value of a sprayed-film resistor.

To start etching treatment, etching conditions, such as coolant temperature, gas type, pressure, source radio-frequency power and bias radio-frequency power, are set in the control apparatus 70 of an etching apparatus. Such a table of relationship between coolant temperature and resistance values as illustrated in FIG. 7 is previously stored in the control apparatus 70, and a wafer potential is calculated using Expression (1) to be described later. Initiating etching treatment causes the control apparatus 70 to begin a processing sequence according to preset given values.

For preset coolant temperature, voltages are applied stepwise to the bipolar electrodes 38 on the basis of the above-mentioned table and the calculated wafer potential, so that the wafer potential is corrected close to 0 V. Examples of a method for applying voltages stepwise include keeping constant voltages to be varied per unit time. Another method is to set the voltages to be varied high immediately after starting to change coolant temperature, and then temporally vary the magnitude of the voltages to be applied, so as to vary the voltages in small steps, when a difference ΔT between the current and preset values of coolant temperature falls below, for example, 5°. Yet another method is to monitor coolant temperature and apply voltages stepwise according to a monitored value of coolant temperature. The present invention is not limited to these methods, however.

Coolant temperature is changed before the start of etching treatment and during the interruption of etching treatment between processing steps. If voltages applied to the bipolar electrodes 38 are not varied when the coolant temperature is changed, the wafer potential shifts from 0 V. Consequently, particles released from inner walls of the chamber adhere to the wafer. In order to prevent the adhesion of particles during the interruption of etching treatment, voltages applied to the bipolar electrodes 38 are varied stepwise when the coolant temperature is changed. This voltage change enables a shift in the wafer potential to be corrected close to 0 V, thereby making it possible to prevent the adhesion of particles. Note that a processing step refers to a minimum constituent part for constituting etching treatment conditions, and etching treatment conditions are composed of one or a plurality of processing steps.

Figure 3:
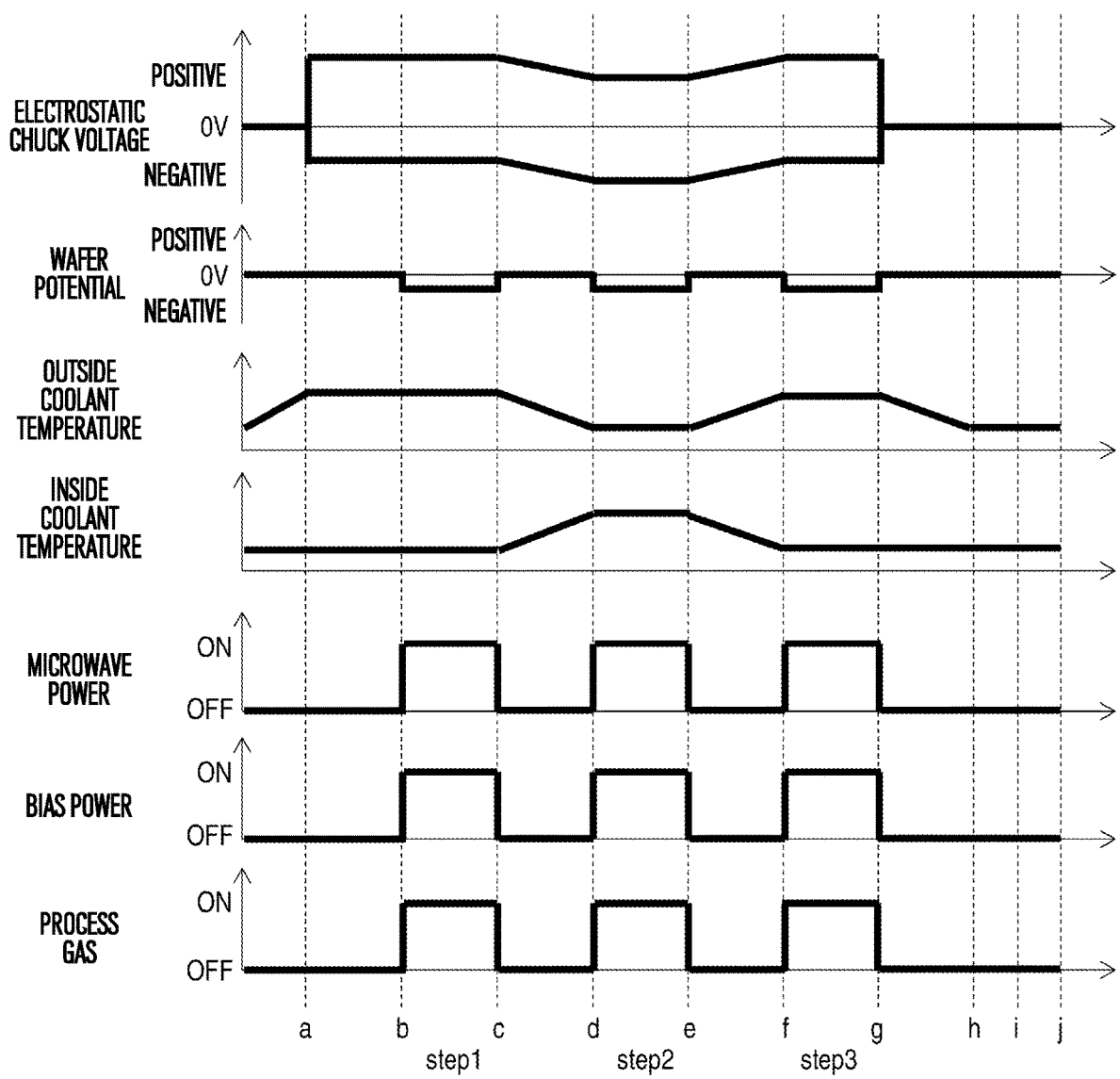
FIG. 3 is a schematic view illustrating an etching treatment sequence according to Embodiment 1.

FIG. 3 illustrates a processing sequence when the present embodiment is applied in etching treatment. As described above, etching conditions used to treat a single wafer are composed of a plurality of etching steps. Here, a case is shown, as one example of the etching conditions, where the etching conditions are composed of three processing steps. Before the wafer 4 is carried into the processing chamber 7, the temperature of a coolant to be supplied to the inner and outer sides of the stage is controlled to a predetermined temperature in processing step 1. Here, assume by way of example that the coolant temperature is controlled under the condition that outside coolant temperature Tout is higher than inside coolant temperature Tin (Tin<Tout). Such a condition is used in a case, for example, where the outer peripheral part of the wafer is higher in etching rate than the central part thereof, and the amount of byproducts produced during etching is larger in the outer peripheral part of the wafer. By setting the outside coolant temperature Tout higher, it is possible to prevent the adhesion of byproducts in the outer peripheral part of the wafer and suppress thickening of pattern widths in the outer peripheral part of the wafer.

Next, when the wafer 4 is carried into the processing chamber 7 and mounted on the stage 6, positive and negative voltages are applied from the DC power supply 55 to the respective bipolar electrodes 38 to hold the wafer 4. Here, if there is any difference between the inside coolant temperature Tin and the outside coolant temperature Tout, the wafer potential shifts from 0 V. If the wafer potential shifts from 0 V, i.e., wafer surfaces become charged, charged particles floating within the processing chamber 7 and particles adherent to inner walls of the processing chamber 7 are attracted and attached to the wafer. That is, particles are caused to adhere onto the wafer before processing step 1 is started.

In conventional technology, the plasma processing apparatus is operated so that the average value of voltages applied to the bipolar electrodes 38 equals 0 V. Consequently, the wafer potential shifts and particles adhere to the wafer. In the present invention, however, the average value of voltages applied to the bipolar electrodes 38 is varied to correct a shift in the wafer potential (point a), in order to prevent particles from adhering to the wafer. Methods for varying the voltages will be described hereinafter.

Figure 5A:
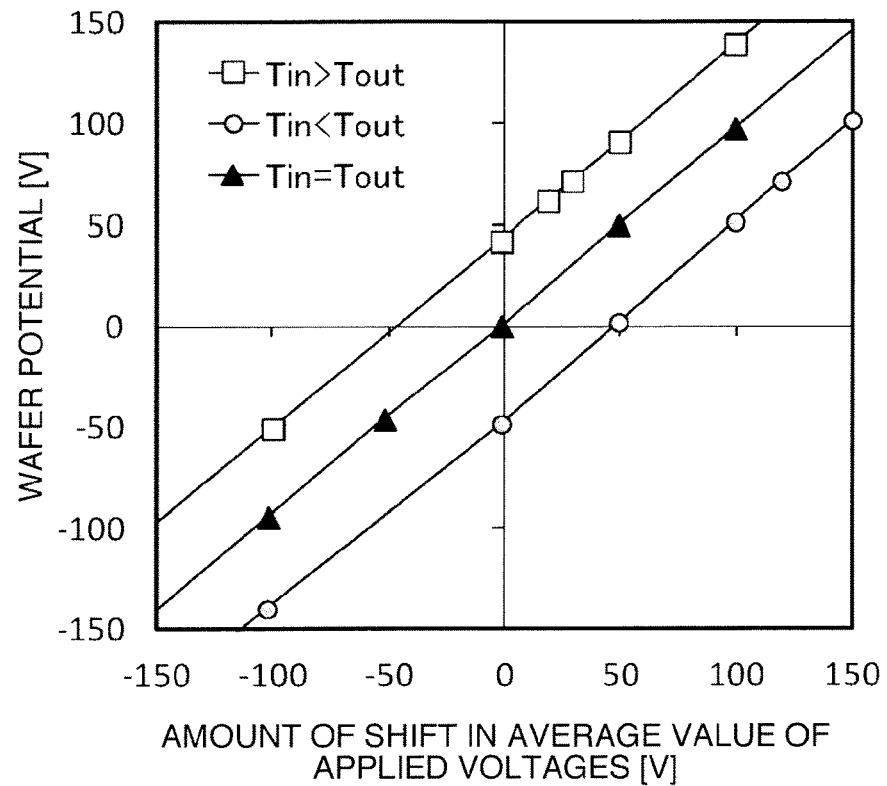
FIG. 5A is a graphical representation illustrating a correlation between DC voltages applied to electrodes and a wafer potential.

FIG. 5A illustrates a relationship among the inside and outside coolant temperatures Tin and Tout, the amount of shift in the average value of voltages applied to the bipolar electrodes 38, and the wafer potential. The wafer potential when the coolant temperatures are set as Tin=Toutsidefined as 0 V. From the results shown in FIG. 5A, the wafer potential when the coolant temperatures are set as Tin<Tout is approximately −50 V in a case where the average value of voltages is 0 V. On the other hand, the wafer potential is approximately +45 V when the coolant temperatures are set as Tin>Tout. Thus, it is understood that if the coolant temperatures Tin and Tout differ, the wafer potential greatly shifts from 0 V, and wafer surfaces are charged.

Figure 5B:
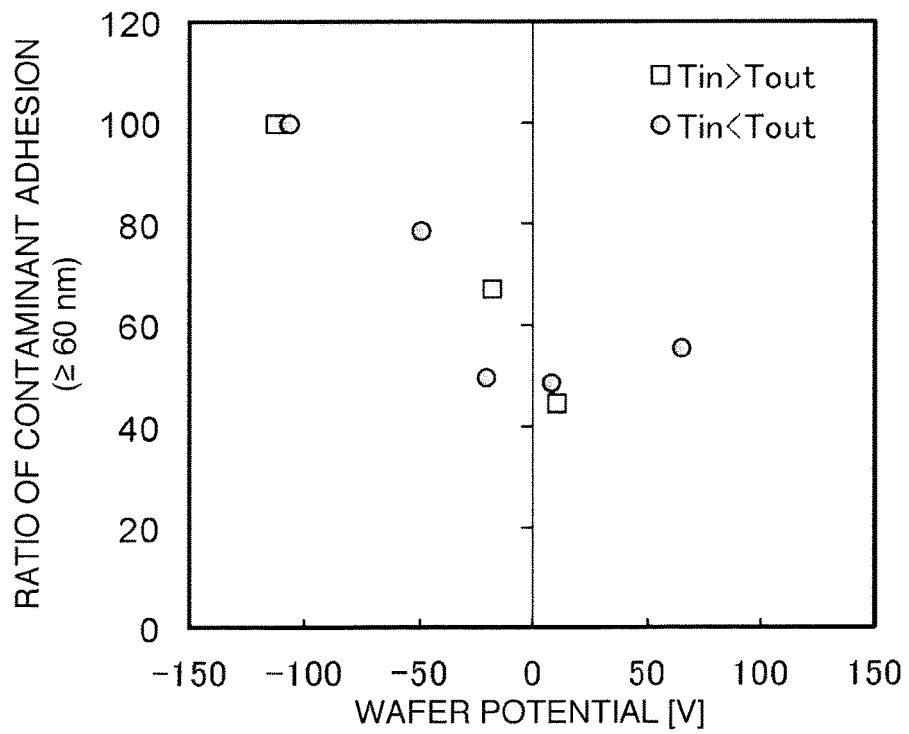
FIG. 5B is a graphical representation illustrating a correlation between a wafer potential and a ratio of contaminant adhesion.

It is also understood that in order to correct the wafer potential close to 0 V in a case where the coolant temperatures are set as Tin<Tout, the average value of voltages applied to the bipolar electrodes 38 needs to be shifted by approximately +50 V. In addition, in a case where the coolant temperatures are set as Tin>Tout, the average value of voltages has only to be shifted by approximately −45 V. FIG. 5B illustrates a relationship between the wafer potential and the ratio of adhesion of particles having a particle diameter of 60 nm or larger. The ratio of contaminant adhesion when the wafer potential is on the order of −100 V is defined as 100%. Then, it is understood that in both of the case where the coolant temperatures are set as Tin<Tout and the case where the coolant temperatures are set as Tin>Tout, the ratio of contaminant adhesion reduces if the wafer potential is corrected so as to vary from −100 V to 0 V.

If the coolant temperatures are set as Tin<Tout, the ratio of contaminant adhesion is approximately 50% within the range of the wafer potentials of approximately −20 V to approximately 10 V, and can thus be reduced greatly. In addition, the ratio of contaminant adhesion is approximately 55% when the wafer potential is further shifted from 0 V toward the positive side up to approximately +65 V. Thus, it is understood that the ratio increases, compared with the ratio when the wafer potential is approximately +10 V. If the coolant temperatures are set as Tin>Tout, the ratio of contaminant adhesion when the wafer potential is approximately −20 V is approximately 70%. Accordingly, a reduction in the ratio of contaminant adhesion is marginal, compared with the case where the coolant temperature satisfies Tin<Tout. On the other hand, the ratio of contaminant adhesion can be greatly reduced to approximately 45% by setting the wafer potential to approximately +10 V also when the coolant temperatures are set as Tin>Tout.

From the results discussed above, it is clear that the wafer potential shifts from 0 V due to a difference in coolant temperature, and that the amount of particles adherent to a wafer increases if the wafer potential shifts. It has also been clarified that in order to prevent the increase of particles due to a change in the coolant temperature, the wafer potential shifted by the change in the coolant temperature has to be corrected to at least within the range of −20 V to +65 V. The ratio of contaminant adhesion may become higher at a wafer potential of −20 V or +65 V, however, depending on the condition of coolant temperature. It is therefore more preferable, from the viewpoint of margins, to correct the wafer potential to within the range of −10 V to +10 V.

In the present embodiment, such a table of relationship between coolant temperature and resistance values as illustrated in FIG. 7 is previously stored. Thus, it is possible to correct the wafer potential to the range of −10 V to +10 V by stepwise varying voltages to be applied to the bipolar electrodes 38 according to a wafer potential calculated using the coolant temperatures and Expression (1) to be described later. The mechanism of shifting in the wafer potential due to a difference in coolant temperature and the mechanism of being able to correct the shifted wafer potential by varying the voltages applied to the bipolar electrodes 38 are considered to be as described hereinafter.

Figure 6:
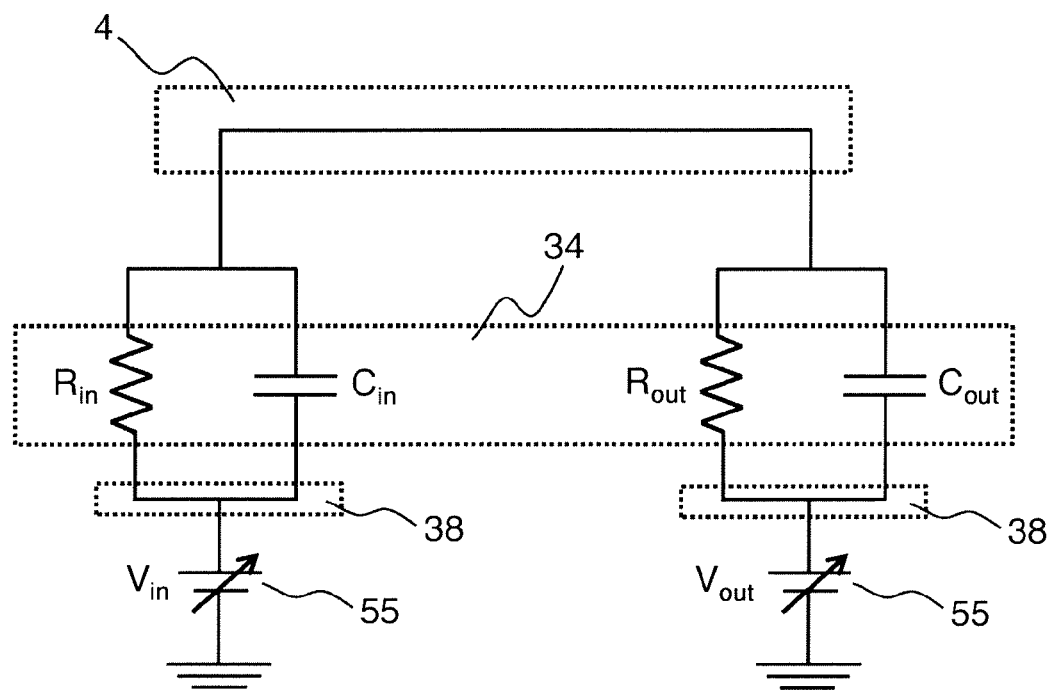
FIG. 6 is a schematic view illustrating an equivalent circuit in which DC power supplies, electrodes, dielectric layers, and a wafer are modeled.

FIG. 6 illustrates an equivalent circuit in which the DC power supply 55, the bipolar electrodes 38, the dielectric layer 34, and the wafer 4 are briefly modeled. Assuming that the wafer potential is Vwaf, a voltage applied to the inner one of the electrodes 38 is Vin, a voltage applied to the outer one of the electrodes 38 is Vout, the resistance of the inner side of the dielectric layer 34 is Rin, and the resistance of the outer side of the dielectric layer 34 is Rout, then the wafer potential Vwaf is represented by Expression (1) shown below.

$$V_{waf} = \frac{V_{in}R_{out} + V_{out}R_{in}}{R_{out} + R_{in}} \qquad \text{Expression (1)}$$

Here, the resistance values Rin and Rout of the dielectric layer 34 have temperature dependence, i.e., vary depending on temperature. FIG. 7 illustrates a relationship between coolant temperature and the resistance values of the dielectric layer 34. The relationship is normalized with the resistance value when the coolant temperature is 20° C. defined as 1. As is understood from this figure, Rin and Rout are approximately equal to each other if the coolant temperature is the same on the inner and outer sides (Tin=Tout), and the resistance values (Rin and Rout) decrease along with the increase of coolant temperature. If the coolant temperature differs as in the case where, for example, Tin is 40° C. and Tout is 20° C., however, the resistance Rin of the inner side of the dielectric layer 34 is approximately 40% in value of the resistance Rout of the outer side of the dielectric layer 34. That is, if the inside coolant temperature Tin and the outside coolant temperature Tout differ, a balance between the resistance values (Rin and Rout) of the inner and outer sides of the dielectric layer 34 changes and the wafer potential Vwaf represented by Expression (1) shifts from 0 V.

From Expression (1) and FIG. 7, it is understood that if wafer potentials when the coolant temperatures set in processing step 1 are expressed as Tin<Tout and as Tin=Tout are compared with the wafer potential when the average value of voltages applied to the bipolar electrodes 38 is 0 V, the wafer potential when the coolant temperatures are expressed as Tin<Tout shifts toward the negative side. In order to correct the wafer potential Vwaf, which will otherwise shift toward the negative side, to within the range of −10 V to +10 V, the average value of voltages applied to the bipolar electrodes 38 is shifted stepwise toward the positive side. The wafer potential Vwaf can thus be corrected.

Figure 4:
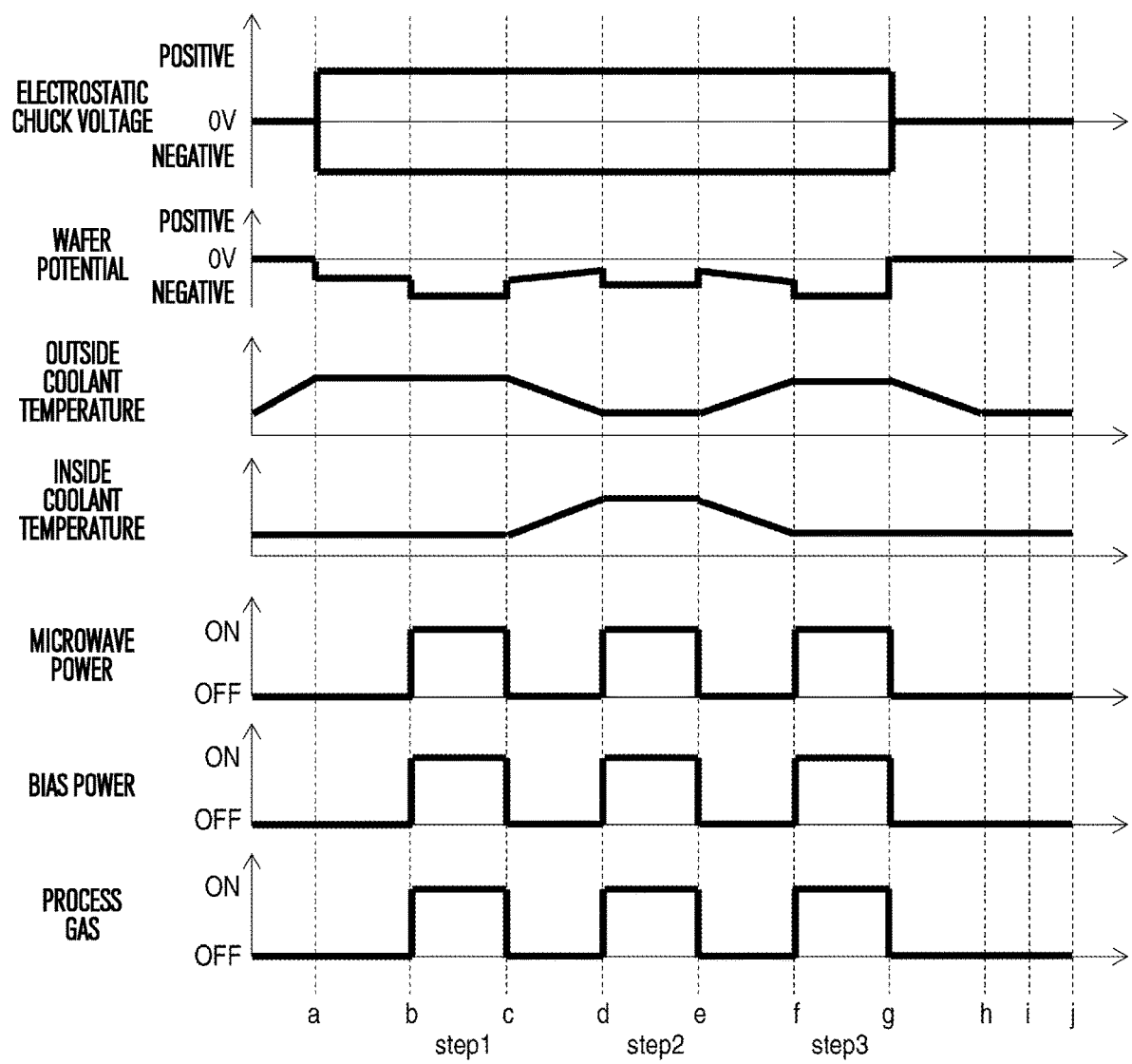
FIG. 4 is a schematic view illustrating a conventional etching treatment sequence.

In such a conventional processing sequence as illustrated in FIG. 4, for example, the average value of voltages applied to the bipolar electrodes 38 is 0 V, i.e., a voltage Vin applied to the inner electrode 38 is +500 V, and a voltage Vout applied to the outer electrode 38 is −500 V. In the present embodiment, however, the voltage Vin applied to the inner electrode 38 is varied stepwise from +500 V so as to increase to, for example, +550 V. Likewise, the voltage Vout applied to the outer electrode 38 is varied stepwise from −500 V so as to increase to, for example, −450 V.

In order to prevent the wafer potential Vwaf from shifting from 0 V for the preset coolant temperatures Tin and Tout, voltages applied to the bipolar electrodes 38 are varied stepwise on the basis of the wafer potential calculated using a previously-stored table of relationship between coolant temperature and resistance values and Expression (1). In the present embodiment, a shift in the wafer potential can be controlled to within the range of −10 V to +10 V by shifting the average value of voltages applied to the bipolar electrodes 38 from 0 V to +50 V. It is therefore possible to prevent particles from adhering to the wafer due to the electrification of the wafer.

After the wafer is adsorbed, He gas (not illustrated) which is a heat-transfer gas is supplied to between the wafer and the stage. The stage temperatures adjusted using a coolant are transferred by the He gas, and therefore, the wafer is controlled to a predetermined temperature (point a). Next, CF$_4$ gas or Cl$_2$ gas, for example, is supplied as a process gas in processing step 1 to regulate the inside pressure of the processing chamber 7 to a predetermined value in processing step 1. After the etching conditions of processing step 1 reach predetermined values, a microwave power of, for example, 800 W is supplied to generate plasma 15. After plasma generation is confirmed, a bias power of, for example, 120 W is supplied (point b).

As the result of applying the bias, etching progresses along patterns formed on the wafer. During plasma generation, the wafer potential slightly varies from 0 V due to effects from the plasma. After a predetermined period of time in processing step 1, the application of the bias power is stopped, the application of the microwave power is stopped, and the plasma 15 is extinguished to stop the progress of etching. Then, a supply of the process gas in processing step 1 is stopped to discharge gases in the processing chamber 7 (point c). Before processing step 1 conditioned such that the coolant temperatures Tin and Tout differ is started, the average value of voltages applied to the bipolar electrodes 38 is varied so as to correct the wafer potential to be shifted to within the range of −10 V to +10 V. Consequently, the wafer potential is maintained at −10 V to +10 V at the moment the plasma 15 is extinguished (point c). Thus, it is possible to prevent particles from adhering to the wafer.

Processing step 2 is conditioned, for example, such that the inside coolant temperature Tin is higher than the outside coolant temperature Tout (Tin=Tout). Such a condition is used if, for example, the central part of the wafer is higher in etching rate than the outer peripheral part thereof and the amount of byproducts produced during etching is larger in the central part of the wafer. Since byproducts adhere to the sidewalls of an etched pattern, the pattern width becomes larger with the increase of the amount byproducts and smaller with the decrease thereof. If the amount of byproducts is larger in the central part of the wafer, a pattern width in the central part of the wafer becomes larger. The adhesion of byproducts can therefore be prevented by raising the inside coolant temperature Tin.

In order to attain the coolant temperature set in processing step 2, the change of coolant temperature is started while etching treatment is interrupted after the completion of processing step 1. According to the preset coolant temperature, voltages are applied stepwise to the bipolar electrodes 38 on the basis of the wafer potential calculated using the abovementioned table and Expression (1), so that the wafer potential is corrected to within the range of −10 V to +10 V (from point c to point d). From Expression (1) and FIG. 7, it is understood that if wafer potentials when the coolant temperatures set in processing step 2 are expressed as Tin=Tout and as Tin=Tout are compared with the wafer potential when the average value of voltages applied to the bipolar electrodes 38 is 0 V, the wafer potential when the coolant temperatures are set as Tin=Tout shifts toward the positive side.

In order to correct the wafer potential Vwaf, which will otherwise shift toward the positive side, to within the range of −10 V to +10 V, the average value of voltages applied to the bipolar electrodes 38 is shifted stepwise toward the negative side, compared with the case where Tin=Tout. The wafer potential Vwaf can thus be corrected. Here, the voltage Vin applied to the inner electrode 38 is varied stepwise from +550 V set in processing step 1 so as to decrease to, for example, +455 V. Likewise, the voltage Vout applied to the outer electrode 38 is varied stepwise from −450 V so as to decrease to, for example, −545 V.

As described above, the voltages to be applied to the bipolar electrodes 38 are varied stepwise on the basis of the wafer potential calculated using a previously-stored table of relationship between coolant temperature and resistance values and Expression (1). Consequently, the wafer potential Vwaf can be corrected to within the range of −10 V to +10 V. Thus, it is possible to prevent particles from adhering to the wafer even while the coolant temperature is changed during the interruption of etching treatment (from point c to point d). Next, after the coolant temperature in processing step 2 reaches a predetermined value, HBr gas or Cl$_2$ gas, for example, is supplied as a process gas in processing step 2. Thus, the inside pressure of the processing chamber 7 is adjusted to a predetermined value in processing step 2.

After the etching conditions of processing step 2 reach predetermined values, a microwave power of, for example, 1000 W is supplied to generate the plasma 15. After plasma generation is confirmed, a bias power of, for example, 80 W is supplied (point d). After a predetermined period of time in processing step 2, the supply of the bias power is stopped and the supply of the microwave power is stopped to extinguish the plasma 15. During plasma generation, the wafer potential slightly varies from 0 V due to effects from the plasma. A supply of the process gas in processing step 2 is stopped to discharge gases in the processing chamber 7 (point e).

As is done at the end of processing step 1, the average value of voltages applied to the bipolar electrodes 38 is varied to correct a shift in the wafer potential due to a change in the coolant temperature to within the range of −10 V to +10 V. Consequently, the wafer potential at the moment the plasma 15 is extinguished (point e) is maintained at −10 V to +10 V. Thus, it is possible to prevent particles from adhering to the wafer. As in the case of processing step 1, processing step 3 is conditioned such that the outside coolant temperature Tout is higher than the inside coolant temperature Tin (Tout=Tin). Since the coolant temperature differs between processing step 2 and processing step 3, the change of coolant temperature is started while etching treatment is interrupted after the completion of processing step 2. As described above, according to the preset coolant temperature, voltages are applied stepwise to the bipolar electrodes 38, so that the wafer potential is corrected to within the range of −10 V to +10 V on the basis of the abovementioned table (from point e to point f).

Since the coolant temperatures set in processing step 3 are expressed as Tin<Tout, as in processing step 1, the wafer potential shifts toward the negative side, compared with the case where the coolant temperatures are set as Tin=Tout. In order to correct the wafer potential Vwaf, which will otherwise shift toward the negative side, to within the range of −10 V to +10 V, the voltage Vin to be applied to the inner electrode 38 is varied stepwise so as to increase from +455 V set in processing step 2 to, for example, +550 V. Likewise, the voltage Vout to be applied to the outer electrode 38 is varied stepwise so as to increase from −545 V to, for example, −450 V.

As described above, the voltages to be applied to the bipolar electrodes 38 are varied stepwise on the basis of the wafer potential calculated using a previously-stored table of relationship between coolant temperature and resistance values and Expression (1). Consequently, the wafer potential Vwaf can be corrected to within the range of −10 V to +10 V. Thus, it is possible to prevent particles from adhering to the wafer even while the coolant temperature is changed during the interruption of etching treatment (from point e to point f).

Next, after the coolant temperature of processing step 3 reaches a predetermined value, BCl$_3$ gas or Cl$_2$ gas, for example, is supplied as a process gas of processing step 3 to regulate the inside pressure of the processing chamber 7 to a predetermined value in processing step 3. After the etching conditions of processing step 3 reach predetermined values, a microwave power of, for example, 600 W is supplied to generate the plasma 15. After plasma generation is confirmed, a bias power of, for example, 60 W is supplied (point f). After a predetermined period of time in processing step 3, the supply of the bias power is stopped and the supply of the microwave power is stopped to extinguish the plasma 15. During plasma generation, the wafer potential slightly varies from 0 V due to effects from the plasma. A supply of the process gas in processing step 3 is stopped to discharge gases in the processing chamber 7 (point g).

As is done at the end of processing steps 1 and 2, the average value of voltages applied to the bipolar electrodes 38 are varied to correct a shift in the wafer potential due to a change in the coolant temperature to within the range of −10 V to +10 V. Consequently, the wafer potential at the moment the plasma 15 is extinguished (point g) is maintained at −10 V to +10 V. Thus, it is possible to prevent particles from adhering to the wafer. After the discharge of the process gas is completed, the voltages applied to the bipolar electrodes 38 are turned off.

Consequently, the force of holding the wafer 4 is removed to enable the wafer 4 to be carried out of the processing chamber 7. If a residual adsorption force arising in the wafer needs to be removed, the voltages applied to the bipolar electrodes 38 are turned off, and then a plasma of a noble gas, such as Ar gas, is generated. Electricity can thus be removed from the wafer. Electricity can also be removed from the wafer by applying voltages opposite in polarity to the voltage applied to the inner and outer electrodes 38.

In a mass-production line, the plasma cleaning treatment of the inner walls of a chamber is performed between periods of wafer processing, with the aim of maintaining the inner walls of the chamber in the same condition for each time of wafer processing. Plasma cleaning treatment is performed after the wafer 4 is carried out of the processing chamber 7. Also in plasma cleaning treatment, the coolant temperatures Tin and Tout set in processing step 3 are changed to the set temperatures for plasma cleaning conditions when setting stage temperature (for example, from point g to point h). If the stage temperature need not be set in plasma cleaning treatment, the coolant temperatures Tin and Tout of processing step 3 may be changed to the coolant temperatures Tin and Tout of processing step 1 of a wafer to be processed next during cleaning treatment.

FIG. 4 illustrates a conventional processing sequence. In the processing sequence, voltages applied to the electrodes 38 are not varied if the coolant temperature is changed, and therefore, the wafer potential shifts toward the negative side (from point a to point g). The wafer potential may shift toward the positive side, depending on positive and negative voltages applied as Vin and Vout. Accordingly, the ratio of contaminant adhesion to a wafer increases, i.e., a large amount of particles adheres to the wafer in the conventional example, as illustrated in FIG. 5B. In the present embodiment in which the wafer potential is corrected, and it is possible to prevent particles from adhering to the wafer. Consequently, it is possible to prevent device defects, such as pattern short-circuiting and discontinuity, caused by particles, and thereby improve yield rates.

In the present embodiment, a processing sequence has been described in which the temperature of the stage 6 is controlled using two inside and outside coolant system. The present invention can also be applied to a stage containing one coolant system and a plurality of heater systems. Hereinafter, this embodiment will be described.

Embodiment 2

Figure 8:
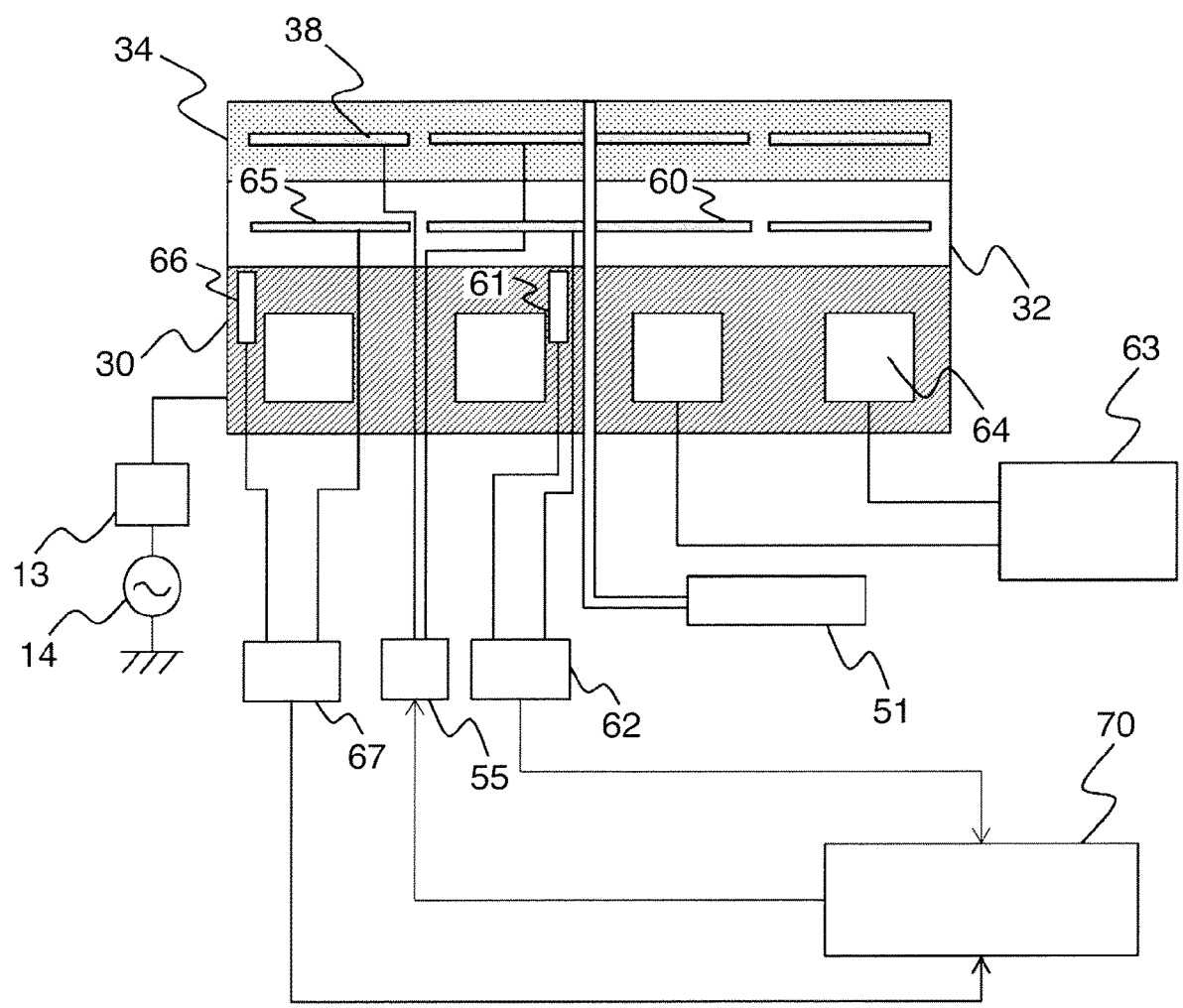
FIG. 8 is a schematic view illustrating the structure of a stage 71 according to Embodiment 2.

FIG. 8 illustrates a system configuration when a stage 71 containing heaters is used. In FIG. 8, constituent parts denoted by the same reference numerals as used in FIG. 2 have the same functions as described in Embodiment 1, and therefore, will not be discussed again here. The stage 71 which is a sample stage includes a dielectric layer 32 formed from, for example, a ceramic sprayed film of $Al_2O_3$, $Y_2O_3$ or the like and disposed on the upper surface of a blast-treated metallic base material 30. A dielectric layer 34 is provided on the upper surface of the dielectric layer 32.

A coolant flow path 64 for adjusting the temperature of a wafer 4 mounted on the stage 71 is disposed within the metallic base material 30. A coolant circulation apparatus 63 having the function of controlling the temperature of a coolant to be supplied to the coolant flow path 64 is connected to the coolant flow path 64 through a pipe. A plurality of heater systems for heating the wafer 4 mounted on the stage 71 is disposed within the dielectric layer 32. Here, an example will be shown in which the plurality of heater systems is composed of two systems, i.e., an inner heater 60 and an outer heater 65.

The inner heater 60 is provided to control the temperature of the central part of the wafer. The temperature of the inner heater 60 is controlled by a heater output regulator 62 on the basis of the monitored value of a temperature monitor 61 placed within the metallic base material 30. The outer heater 65 is provided to control the temperature of the outer peripheral part of the wafer. The temperature of the outer heater 65 is controlled by a heater output regulator 67 on the basis of the monitored value of a temperature monitor 66 placed within the metallic base material 30. A gas supply mechanism 51 for supplying He gas, for example, is connected to a gap between the stage 71 and the wafer 4.

The temperatures of the inner heater 60, the outer heater 65 and the coolant are controlled to adjust the temperature of the stage, and the temperature of the stage is transferred to the wafer 4 mounted on the stage 71 to control the wafer 4 to a predetermined temperature by means of the pressure and flow rate of the He gas. Such a table of relationship between coolant temperature (wafer temperature or stage temperature in the present embodiment) and resistance values as illustrated in FIG. 7 is previously stored in the control apparatus 70 of an etching apparatus, and a wafer potential is calculated by Expression (1). Initiating etching treatment causes the control apparatus 70 to begin a processing sequence according to preset given values.

Figure 9:
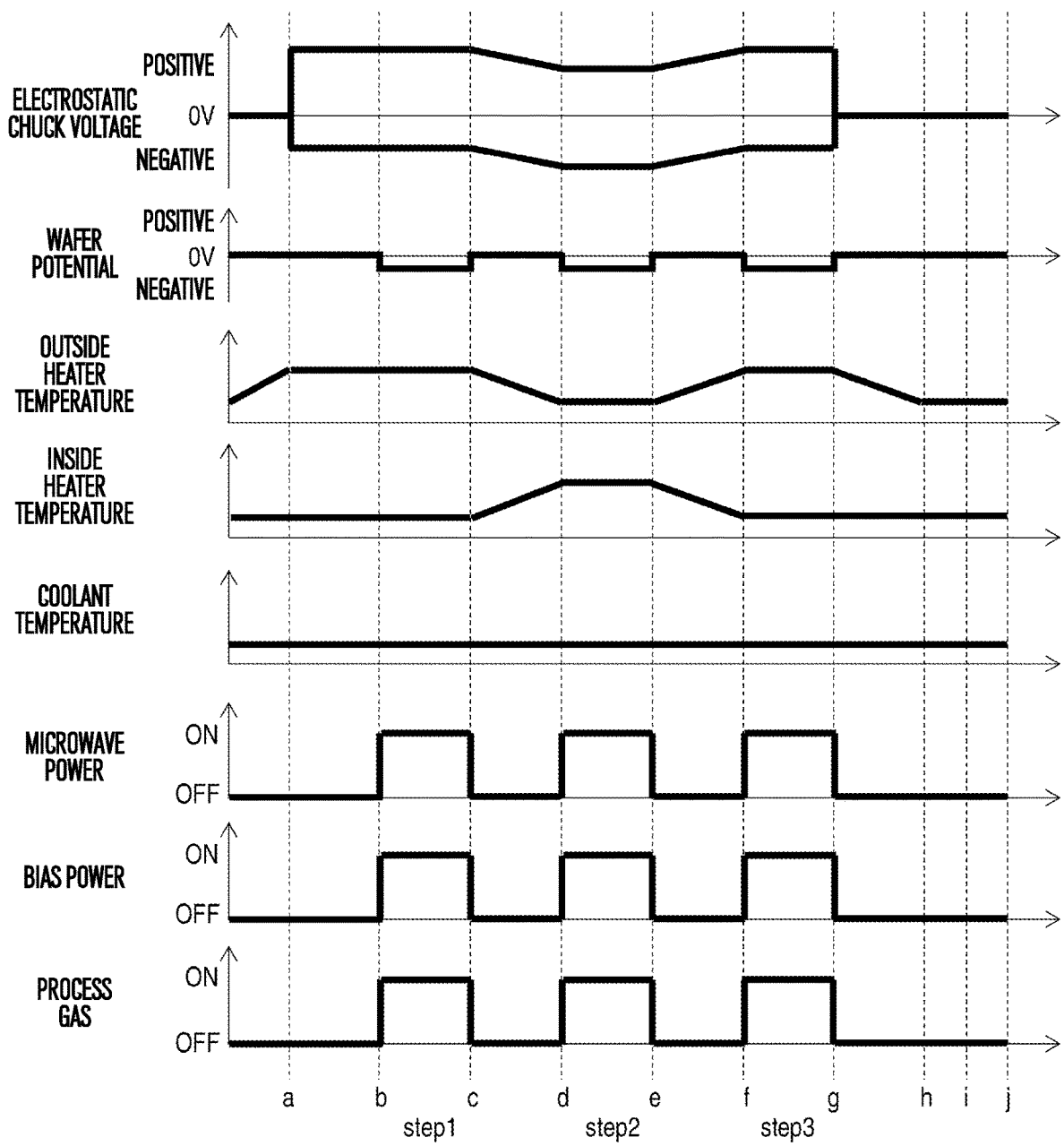
FIG. 9 is a schematic view illustrating an etching treatment sequence according to Embodiment 2.

To change the wafer temperature, the outputs of the inner and outer heaters 60 and 65 are adjusted by the coolant circulation apparatus 63 while maintaining the coolant at a constant temperature. The wafer temperature is thus controlled. For the preset wafer temperature, voltages are applied stepwise to the bipolar electrodes 38 on the basis of the abovementioned table and the calculated wafer potential, so that the wafer potential is corrected to within the range of −10 V to +10 V. A method for applying voltages stepwise is as described in Embodiment 1. FIG. 9 illustrates a processing sequence in a case where the present embodiment is applied during the interruption of etching treatment. Here, a case is shown, by way of example, where the processing sequence is composed of three processing steps. This processing sequence differs from the processing sequence shown in FIG. 3 in that the wafer temperature is controlled by the inner and outer heaters and that the temperature of the coolant supplied to the stage is maintained constant by the coolant circulation apparatus 63.

The inside heater temperature and outside heater temperature of each processing step are the same in behavior as the inside coolant temperature and outside coolant temperature shown in FIG. 3. That is, the outside heater temperature is higher than the inside heater temperature in processing step 1, the inside heater temperature is higher than the outside heater temperature in processing step 2, and the outside heater temperature is higher than the inside heater temperature in processing step 3. Assuming that the resistance value of the inner side of the dielectric layer 34 and the resistance value of the outer side of the dielectric layer 34 are also the same as those in Embodiment 1, then the behavior of the wafer potential indicates the same tendency.

Accordingly, the behavior in which in the average value of voltages applied to the inner and outer electrodes is shifted also indicates the same tendency. The stage structure of the present embodiment differs from the stage structure described in Embodiment 1 in that the temperature of the stage can be changed in a short period of time by changing the temperatures of the inner and outer heaters, while maintaining the coolant temperature constant.

As described above, also in the structure of the stage 71 described in the present embodiment, voltages are applied stepwise to the bipolar electrodes 38 according to the preset inside and outside wafer temperatures, so that the wafer potential is corrected to within the range of −10 V to +10 V on the basis of the abovementioned table and the calculated wafer potential. By shifting the average value of voltages applied to the bipolar electrodes 38, it is possible to prevent particles from adhering to the wafer. Consequently, it is possible to prevent device defects, such as pattern short-circuiting and discontinuity, caused by particles, and thereby improve yield rates.

Note that the structures of the stages 70 and 71 described in Embodiments 1 and 2 are illustrative only. Alternatively, the dielectric layers 34 and the dielectric layer 32, for example, may be coating films, such as sintered ceramic films or CVD or PVD films, rather than sprayed films. In addition, the embodiments may include a plurality of coolant flow path systems for controlling the wafer temperature. Yet alternatively, a plurality of heater systems may be built in the stage 71, as described above. Even if the stages 70 and 71 differ in structure as described above, it is obvious that the present invention can be applied when the wafer temperature is changed.

In Embodiments 1 and 2, cases have been discussed in which stages based on a Johnson-Rahbeck type electrostatic chuck system are used. The present invention can also be applied, however, when a stage based on a Coulomb-type electrostatic chuck system is used. Since a dielectric layer is formed between bipolar electrodes and a surface of the stage with which a wafer has contact also in the stage based on a Coulomb-type electrostatic chuck system, the resistance value of the dielectric layer is varied by changing wafer temperature, i.e., by changing coolant temperature or heater temperature.

Accordingly, a wafer potential is also shifted. In order to correct a shift in the wafer potential to within the range of −10 V to +10 V, voltages applied to bipolar electrodes may be controlled stepwise on the basis of a wafer potential calculated using a table showing the relationship between the coolant temperature (or the wafer temperature or the stage temperature) and the resistance values of the dielectric layer and Expression (1), as described in Embodiments 1 and 2.

In addition, in Embodiments 1 and 2, a processing sequence has been described in which a supply of process gas is stopped during the interruption of processing steps. Alternatively, however, a process gas for the next processing step, for example, may be supplied during the interruption of etching treatment. It is obvious that the present invention can also be applied even when a noble gas, such as Ar gas, is supplied rather than the process gas.

As described above, a mode for carrying out the invention has been discussed in Embodiments 1 and 2 where voltages applied to the bipolar electrodes are controlled stepwise, according to the preset stage temperature, on the basis of a wafer potential calculated using a table showing the relationship between the coolant temperature (or the wafer temperature or the stage temperature) and the resistance values of the dielectric layer and Expression (1), in order to correct a shift in the wafer potential caused by a change in the wafer temperature, i.e., the stage temperature in a processing sequence in which the wafer temperature is changed during the interruption of etching treatment.

From the viewpoint of the technical idea of the present invention, however, the invention is characterized by preventing (correcting) the shift of a wafer potential due to temperature change. Accordingly, the present invention is intended for application to both an in-plane temperature difference in the stage and a temperature change between processing steps. In addition, from the viewpoint of the technical idea of the present invention, it is important to bring a wafer potential close to 0 V in the absence of plasma. Accordingly, the present invention is applicable not only during the interruption of etching treatment (between processing steps) but also before the start of plasma treatment and after the shutdown of plasma following the last processing step.

Since the present invention is as has been described heretofore, particles can be prevented from adhering to a wafer due to the electrification of the wafer caused by the shift of a wafer potential by correcting the wafer potential. Consequently, it is possible to prevent device defects, such as pattern short-circuiting and discontinuity, caused by particles, and thereby improve yield rates.

The present invention is not limited to the above-described electron cyclotron resonance-type plasma processing apparatus, but is also applicable to, for example, inductively-coupled plasma (ICP) processing apparatus and capacitively-coupled plasma (CCP) processing apparatus. The present invention is not limited either to the fields of semiconductor device manufacturing and inspection, but is also applicable to a variety of other fields, including the manufacture of flat-panel displays and processing apparatus using plasma.

It should be noted that the present invention is not limited to the above-described respective embodiments but includes various modified examples. For example, the above-described embodiments have been described in detail for ease of understanding the present invention, and are not necessarily limited to plasma processing apparatus equipped with all of the constituent parts described. In addition, some of the constituent parts of one embodiment may be substituted for constituent parts of another embodiment. Yet additionally, constituent parts of another embodiment may be added to the constituent parts of one embodiment. Still additionally, constituent parts of other embodiments may be added, deleted or substituted with respect to some of the constituent parts of each embodiment.

The invention claimed is:

1. A plasma processing apparatus comprising:
 a processing chamber in which a sample Is plasma-processed;
 a radio-frequency power source for supplying radio-frequency power to generate plasma;
 a sample stage which is provided with a plurality of electrodes comprising an inner electrode and an outer electrode, for electrostatically chucking the sample and on which the sample is mounted;
 a DC power supply for applying DC voltages to the plurality of electrodes;
 a plurality of heaters disposed in the sample stage and comprising an inner heater and an outer heater; and
 a control apparatus configured to control the DC power supply to each of the inner electrode and the outer electrode to apply said DC voltages so as to make a range of a potential of the sample on the basis of a table and a calculated sample potential to be within a corrected range of the potential of the sample when a temperature of the sample stage before starting plasma-processing is adjusted to a preset temperature of the sample stage in the absence of plasma, the table defining a relationship between temperature and resistance values, and when an inside temperature of the inner heater is different from an outside temperature of the outer heater, wherein the control apparatus is further configured to control a temperature of the plurality of heaters such that a temperature of the outer heater is higher than a temperature of the inner heater during a period of a first processing step, the temperature of the inner heater is higher than the temperature of the outer heater during a period of a second processing step, and the temperature of the outer heater is higher than the temperature of the inner heater during a period of a third processing step, while maintaining a temperature of a stage coolant at a substantially constant value during the first, second, and third processing steps, and wherein the first, second, and third processing steps are performed in that order.

2. The plasma processing apparatus according to claim 1, wherein the temperature of the sample stage is controlled by the inner heater and the outer heater.

3. The plasma processing apparatus according to claim 2, wherein the potential of the sample is a value that prevents particles from adhering to the sample.

4. The plasma processing apparatus according to claim 1, wherein the potential of the sample is a value that prevents particles from adhering to the sample.

\* \* \* \* \*